United States Patent [19]

Shalev et al.

[11] Patent Number: 5,475,871
[45] Date of Patent: Dec. 12, 1995

[54] COMMUNICATION SYSTEM WITH CONTROL SIGNAL BASED TUNING

[75] Inventors: Doron Shalev, Alfei Menasche; Gadi Shirazi, Ramat Gan, both of Israel

[73] Assignee: Motorola, Inc., Schaumburg, Ill.

[21] Appl. No.: 112,166

[22] Filed: Aug. 25, 1993

[30] Foreign Application Priority Data

Aug. 29, 1992 [GB] United Kingdom ............ 9218451

[51] Int. Cl.$^6$ .................................................. H04B 1/40
[52] U.S. Cl. ........................ 455/70; 455/77; 455/266
[58] Field of Search ........................... 455/34.1, 34.2, 455/70, 77, 266, 339, 340, 254, 71, 268, 266, 89; 307/521; 328/167; 333/17.1, 174

[56] References Cited

U.S. PATENT DOCUMENTS

| | | | |
|---|---|---|---|
| 4,087,756 | 5/1978 | Rogers, Jr. | 329/50 |
| 4,339,829 | 7/1982 | Dimon | 455/339 |
| 4,619,002 | 10/1986 | Thro | 455/226 |
| 5,058,204 | 10/1991 | Tahernia et al. | 455/183 |
| 5,134,318 | 7/1992 | Itoh | 307/521 |
| 5,203,011 | 4/1993 | Bane et al. | 455/34.1 |
| 5,220,681 | 6/1993 | Belgina | 455/156.1 |
| 5,281,931 | 1/1994 | Bailey et al. | 333/17.1 |
| 5,327,582 | 7/1994 | Wong | 455/77 |
| 5,339,455 | 8/1994 | Vogt et al. | 455/266 |
| 5,404,589 | 4/1995 | Bijker et al. | 455/266 |

FOREIGN PATENT DOCUMENTS

| 0117499 | 9/1984 | European Pat. Off. |
| 1410251 | 10/1975 | United Kingdom. |

Primary Examiner—Edward F. Urban
Attorney, Agent, or Firm—Robert S. Babayi; Andrew S. Fuller

[57] ABSTRACT

A communications system (10) comprising a base station (12) for controlling a control channel signal and a plurality of traffic channels and a communications device (17) responsive to the control channel signal (16) and receptive to the plurality of traffic channels. The communications device comprises a tuneable filter (48), having an adjustable characteristic, which substantially filters all but a selected traffic channel of the plurality of traffic channels. The communications device further comprises a tuning circuit (24, 38, 40, 44, 46, 52) for adjusting the filter characteristic. The tuning circuit (24, 38, 40, 44, 46, 52) uses the control channel signal (16) as an accurate central frequency ($F_o$) for a passband of the tuneable filter (48) and adjusts the filter characteristic to substantially a minimum insertion loss at the accurate central frequency, thereby substantially optimizing selectivity and sensitivity for the communications device (17).

34 Claims, 2 Drawing Sheets

COMMUNICATION SYSTEM WITH CONTROL SIGNAL BASED TUNING

BACKGROUND OF THE INVENTION

This invention relates, in general, to frequency calibration of frequency filters in a portable radio and is particularly, but not exclusively, applicable to the automatic field tuning of an IF filter in a trunked radio system with either full duplex or half duplex capabilities.

TECHNICAL FIELD

It is well known that an intermediate frequency crystal (IF) band pass filter (BPF) in a frequency modulated (FM) radio suffers degradation in sensitivity and selectivity due to uncompensated temperature changes in the crystal filter and associated matching networks. Furthermore, sensitivity and selectivity problems arise from the natural ageing of the crystal filter. Specifically, the bandpass filter becomes susceptible to insertion loss and frequency drift. Eventually, degradation in sensitivity and selectivity of the FM radio becomes such that the radio must be sent to a laboratory for the re-calibration thereof.

On the return of a FM radio to a laboratory, intermediate frequency tuning, i.e. the adjustment of the filter characteristic of the bandpass filter, is either accomplished through manual adjustment or automatic adjustment thereof. Tuning of an IF bandpass filter is achieved, conventionally, by the application of a direct current (dc) voltage to varactor diodes coupled to the IF bandpass filter. Specifically, the IF filter is tuned by controlled adjustment of the capacitance of the varactor diodes. Moreover, control of the voltage administered to the varactor diodes is regulated by the combination of a D/A converter in association with a microprocessor. It will be appreciated that the D/A converter and the microprocessor are located within the FM radio. Manual tuning involves tedious physical adjustment of circuits within the FM radio. In the case of automatic factory tuning, expensive equipment, such as an automatic frequency counter, is required to achieve accurate tuning thereof. Neither of the above tuning methodologies make provisions for short or long term variation in filter characteristics of bandpass filters arising from temperature sensitivity, nor do these methods address the problems associated with the ageing of the crystal filter. In fact, short term temperature variations which affect the radios performance are neglected by the manufacturer. This rather unsatisfactory omission is reflected in that the FM radio experiences reduced operational performance at temperature extremes.

It can be appreciated that there is a requirement within the art to provide a FM radio having an intermediate bandpass filter which is substantially divorced from sensitivity and selectivity problems and, more particularly, does not require re-calibration at a specialised laboratory.

SUMMARY OF THE INVENTION

This invention addresses at least some deficiencies which prevail in the prior art described above. In accordance with the present invention there is provided a communications system comprising a base station for controlling a control channel signal and a plurality of traffic channels and a communications device responsive to said control channel signal and receptive to said plurality of traffic channels. The communications device comprises a tuneable filter, having an adjustable characteristic, which substantially filters all but a selected traffic channel of said plurality of traffic channels. The communications device further comprises a tuning circuit for adjusting said filter characteristic. The tuning circuit uses the control channel signal as an accurate central frequency for a passband of the tuneable filter and adjusts said filter characteristic to substantially a minimum insertion loss at said accurate central frequency, thereby substantially optimising selectivity and sensitivity for the communications device.

In the preferred embodiment of the present invention, the communications device modulates a reference frequency to provide a first modulated frequency signal and then modulates the accurate control signal therewith to produce a modulated intermediate frequency signal having a high index of modulation. The bandwidth of a tuneable filter is filled with a high density of Bessel lines resulting from the application of the modulated intermediate frequency signal thereto. Furthermore, internal temperature measurement circuitry measures the operating temperature of the communications device, whereby the filter characteristic is adjusted, periodically, according to the operating temperature of the communications device. In accordance with a further embodiment of the present invention, a received signal strength indicator circuit provides a signal in respect of a signal transmitted from the base station and the tuning network adjusts the filter characteristic with respect thereto.

More particularly, the tuning network, of a preferred embodiment of the present invention, substantially maximises the RSSI signal at the accurate central frequency ($F_o$), whereby said filter characteristic is adjusted to substantially a minimum insertion loss thereat. In a further embodiment, a synthesiser simulates an upper and a lower traffic channel, transmitted by said base station, adjacent to the accurate central frequency, wherein said tuning network substantially minimises the RSSI signal in each of these adjacent channels, whereby the filter characteristic is substantially adjusted to a maximum insertion loss thereat.

In the preferred embodiment of the present invention, the tuning network comprises at least one varactor diode and, during simulation of aid adjacent upper and lower channels, a software algorithm controlled by a microprocessor locks out all signals received by the communications device.

In an aspect of the present invention, adjustment of the filter characteristic is achieved through the application of data words, generated by a microprocessor in response to the RSSI signals, to the tuning network which controllably adjust the capacitance the at least one varactor diode. In a further aspect of the invention, a statistically compiled data table, stored in memory, relates data words required to adjust the filter characteristic to both an operating temperature for the communications device and an operating characteristic particular to a tuneable filter and an associated tuning network. The operating characteristic are compiled in accordance with additional operating parameters, such as variation in performance arising from ageing of the tuneable filter and tuning network and to variations arising from manufacturing tolerances.

The present invention is applicable to trunked radio systems having full duplex or half duplex operating capabilities, and uses a modulated or unmodulated control channel for the accurate central frequency. Furthermore, the preferred embodiment of the present invention allows a user to request that the communications device be tuned whilst the communications device (17) is in an operational environment. Moreover, the preferred embodiment provides an audio and/or visual alert for alerting a user that adjustment of the filter characteristic has been completed.

In accordance with the present invention, there is provided a method of adjusting a filter characteristic of a tuneable filter of a communications device, the method comprising the steps of tuning the tuneable filter of the communications device to receive a control channel signal transmitted at an accurate frequency by a base station responsible for the control of said communications device and then centralising the accurate frequency control channel signal at the centre of a passband of the tuneable filter. The filter characteristic is adjusted to substantially a minimum insertion loss at said centre of the passband, thereby substantially optimising selectivity and sensitivity for the communications device. Subsequently, the tuneable filter is tuned to selectively receive a traffic channel, from a plurality of traffic channels transmitted by said base station, by substantially filtering all but a selected traffic channel of said plurality of traffic channels.

An exemplary embodiment of the invention will now be described with reference to the accompanying drawings.

DETAILED DESCRIPTION OF THE PREFERRED EMBODIMENTS

Figure 1:
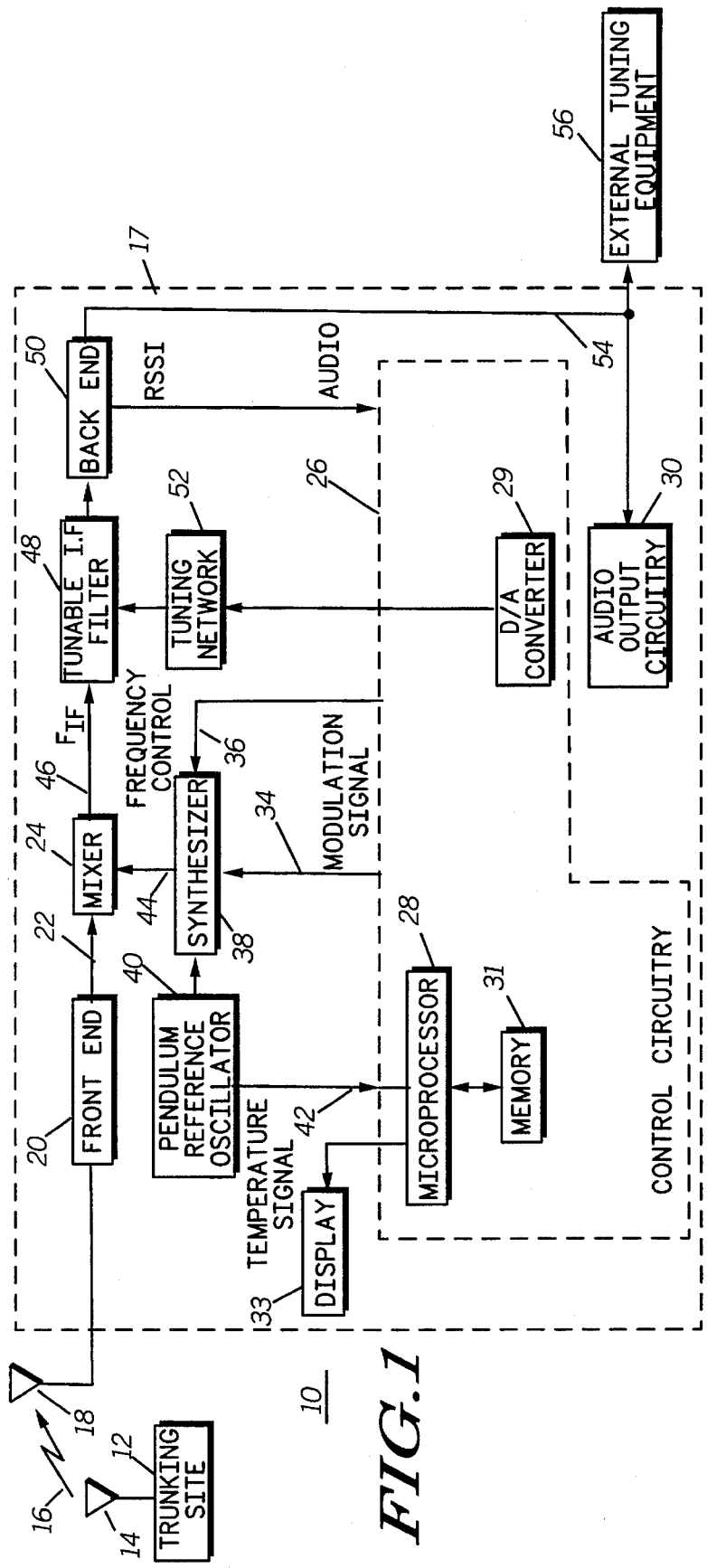
FIG. 1, is a block diagram of a trunked radio system in accordance with the present invention.

The present invention overcomes the deficiencies set forth above by providing a closed loop adjustment of a filter characteristic of an intermediate frequency bandpass filter. More particularly, an overall improvement in radio sensitivity and selectivity is achieved through periodic re-calibration of the IF filter. With reference to FIG. 1, there is shown a preferred embodiment of a trunked radio system 10 in accordance with the present invention. A trunking site or base station 12 administers control of the trunked radio system in a specific area and continuously transmits, through an antenna 14, an accurate high frequency signal on a control channel 16 of the trunked radio system 10. The accuracy of the high frequency signal 16 is, typically, 0.5 ppm or better. Furthermore, the high frequency signal of the control channel 16 has a relatively clean spectrum with low interference. It will be appreciated by one skilled in the art that the accurate high frequency signal can be either a modulated or an unmodulated signal.

A radio 17, responsive to the trunked system 10, receives the high frequency signal of the control channel 16 through an antenna 18 thereof. The received high frequency signal acts as an input signal to a front end 20 of the radio 17. As will be understood by one skilled in the art, the front end 20 comprises, amongst other components, filters and amplifiers. A filtered amplified signal 22 emanates from the front end 20 and provides a first input to a mixer 24. The radio 17 further comprises control circuitry 26 and a display 33. The control circuitry includes a microprocessor 28, a D/A converter 29, and memory 31 coupled to the microprocessor 28 and filters 32. The control circuitry 26 provides a modulation signal 34 and a frequency control signal 36 to a synthesiser 38. The frequency control signal 36 subsequently selects a particular synthesiser channel. A reference oscillator 40, such as the frequency oscillator Pendulum™, manufactured by Motorola Inc., provides a reference frequency signal to the synthesiser 38. Furthermore, the reference oscillator 40 provides a temperature measurement signal 42 to the microprocessor or 28. The temperature signal 42 represents a measurement of the operating temperature of the radio 17. It will be appreciated by one skilled in the art that a Pendulum™ frequency oscillator has an in-built temperature measurement capability. [Pendulum™ is a trade mark of Motorola Inc.]

The synthesiser 38 modulates the reference frequency signal with the modulation signal 34 and provides a modulated synthesiser signal 44 to a second input of the mixer 24. The mixer 24 mixes the modulated synthesiser signal 44 with the filtered amplified signal 22 to provide a modulated intermediate frequency (IF) signal $f_{if}$ 46. The intermediate frequency signal $f_{if}$ 46 provides an input to a tuneable intermediate frequency crystal bandpass filter (BPF) 48 as will be appreciated by one skilled in the art. Furthermore, it will be appreciated that the tuneable intermediate frequency bandpass filter (BPF) 48 may be a first filter in a succession of tuneable bandpass filters and, as such, references to a tuneable intermediate frequency bandpass filter (BPF) 48 and subsequent references to circuitry coupled thereto should be construed accordingly. The tuneable intermediate frequency bandpass filter (BPF) 48 is coupled to a back end 50 of the radio 17. The back end 50 typically comprises a demodulator, received signal strength indicator (RSSI) circuitry and filters. Additionally, the tuneable intermediate frequency bandpass filter (BPF) 48 is responsive to a tuning network 52. The tuning network 52 is responsible for the controlled tuning of the tuneable intermediate frequency bandpass filter (BPF) 48 in accordance with techniques obvious to one skilled in the art. Moreover, the tuning network 52 is coupled to the microprocessor 28 through the D/A converter 29. Furthermore, it will be appreciated that the tuning network 52 typically comprises varactor diodes. The back end 50 provides a RSSI signal to the control circuitry 26. The back end 50 further provides an audio signal. The audio signal 54 is coupled to audio output circuitry 30. In addition, the audio signal may provide a signal to other external circuitry, such as external monitoring or tuning circuitry 56 e.g. a SINAD meter.

Figure 2:
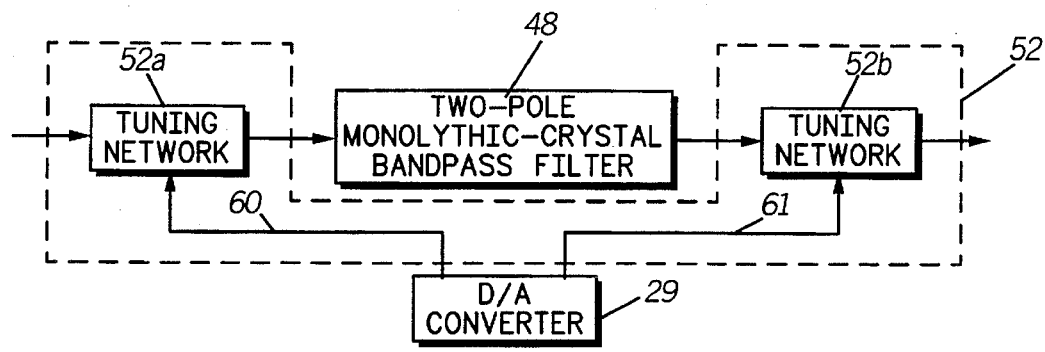
FIG. 2, illustrates a preferred embodiment of control circuitry suitable for tuning a 2-pole crystal bandpass filter incorporated within FIG. 1.

With reference to FIG. 2, there is shown a typical circuit configuration through which the D/A converter 29 tunes the intermediate frequency (IF) filter 48. In this illustration, the intermediate frequency (IF) filter 48 is shown as a two-pole monolithic crystal bandpass filter 48. The two-pole monolithic crystal bandpass filter 48 is coupled between two tuning networks 52a and 52b. The tuning networks 52a and 52b are responsive to the D/A converter 29 through control lines 60 and 61 respectively. In general, the tuneable IF filter 48 may be of multiple pole configuration, whereby N two-pole monolithic crystal bandpass filters are interspersed between N+1 tuning networks, and the D/A converter 29 provides control lines to each of the N+1 tuning networks.

Figure 3:
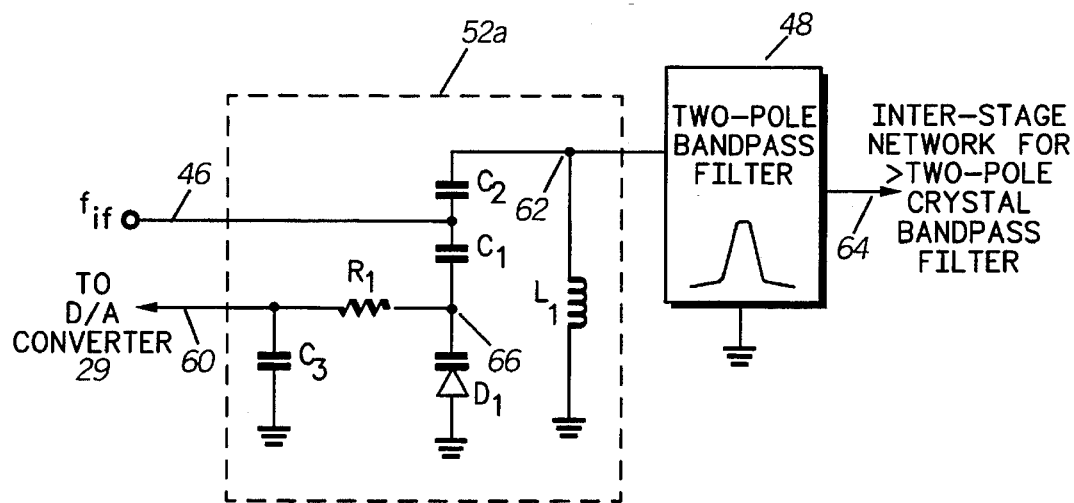
FIG. 3, illustrates a preferred embodiment of an input/output tuning network suitable for a 2-pole crystal bandpass filter incorporated within FIG. 1.

Referring to FIG. 3, tuning network 52a is shown in greater detail. Modulated intermediate frequency (IF) signal $f_{if}$ 46 provides an input between capacitors $C_1$ and $C_2$. Capacitor $C_2$ is coupled to an input of 2-pole crystal bandpass filter 48. An inductor $L_1$ is coupled between ground and a circuit node 62 located between the capacitor $C_2$ and the input of 2-pole crystal bandpass filter 48. Crystal bandpass filter 48 provides an output 64 which is either input to another 2-pole crystal bandpass filter through tuning network 52c, therein forming a multiple pole bandpass filter, or input to the back end 50 through tuning network 52b. The 2-pole crystal bandpass filter 48 is coupled to ground. Resistor $R_1$ is coupled between control line 60, of D/A converter 29, and circuit node 66. Circuit node 66 is located between a second terminal of capacitor $C_1$ and the cathode of varactor diode $D_1$. The anode of varactor diode $D_1$ is coupled to ground. A third capacitor $C_3$ is coupled between ground and control line 60.

Figure 4:
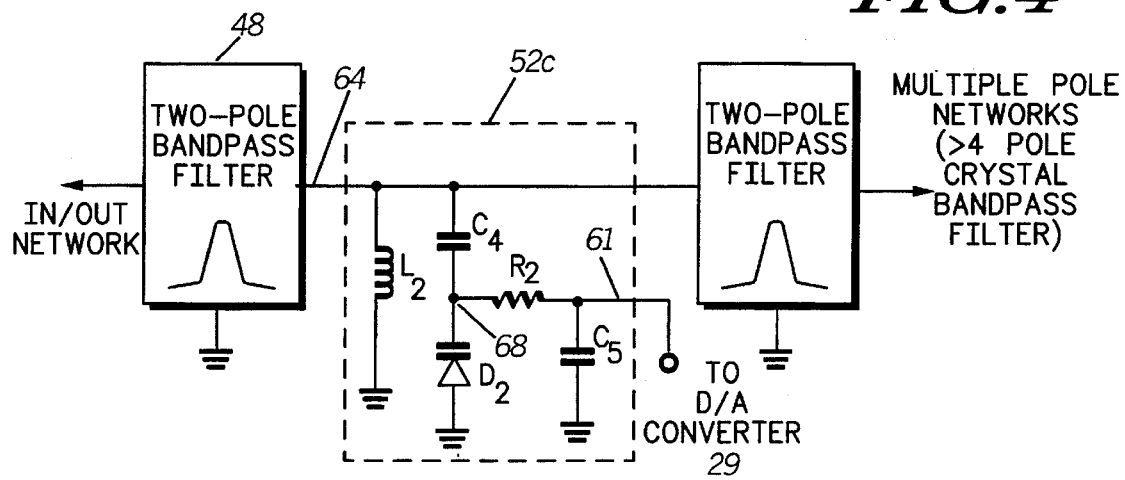
FIG. 4, illustrates a preferred embodiment of an interstage tuning network suitable for implementation between 2-pole bandpass filters incorporated within FIG. 1.

Referring to FIG. 4, tuning network 52c is shown in greater detail. Tuning network 52c may either provide an input to a multiple pole bandpass filter. An inductor $L_2$ is coupled between ground and output 64. Output 64 is further coupled to a capacitor $C_4$. Resistor $R_2$ is coupled between control line 61, of D/A converter 29, and circuit node 68. Circuit node 68 is located between a second terminal of capacitor $C_4$ and the cathode of varactor diode $D_2$. The anode of varactor diode $D_2$ is coupled to ground. A further capacitor $C_5$ is coupled between ground and control line 61.

It will be appreciated that the characteristic impedance of a crystal bandpass filter in combination with its associated tuning networks may require implementation of alternate circuit embodiments to those exemplified in FIGS. 3 and 4, and that these alternate circuit embodiments would be apparent to one skilled in the art.

Figure 5:
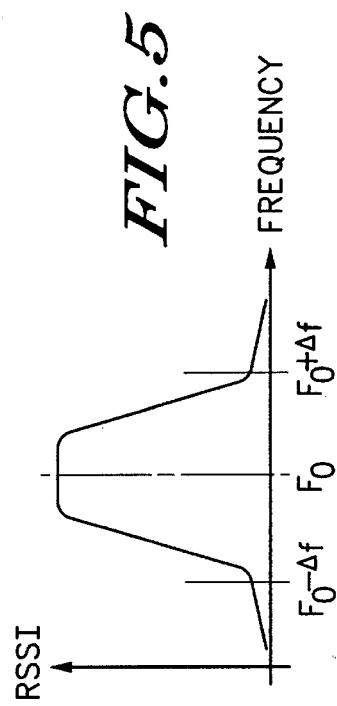
FIG. 5, illustrates IF Filter tuning methodology implemented by the preferred embodiment of FIG. 1.

In accordance with the preferred embodiment of the present invention, adjustment of the filter charactersitic of the intermediate bandpass filter 48 is based on the modulation in the synthesiser 38 of the reference frequency generated by the reference oscillator 40 and the provision of an intermediate frequency signal $f_{if}$ by mixing the control channel signal 16 with the modulated synthesiser signal 44. It can be appreciated that the control channel signal 16 provides a highly accurate signal source for the calibration of the IF filter 48. At initial adjustment (tuning) of the filter characteristic of the intermediate bandpass filter of the radio, an alternative high accuracy frequency source, such as a frequency generator, is substituted for the control channel signal 16. The use of the modulated synthesiser signal 44 as a modulation mechanism for the control channel signal 16 ensures that the control channel signal 16 is modulated with a very high index of modulation i.e. a low frequency audio signal with high deviation, which fills the bandwidth of the IF filter 48 with a high density of Bessel lines. More specifically, adjustment of the IF filter characteristic is achieved through the measurement of the radio's operating temperature and the subsequent adjustment of the IF filter characteristic using the received signal strength indicator (RSSI) signal (FIG. 5).

In the preferred embodiment of the present invention, the index of modulation b for the tuning procedure calls for a value typically in the range of 10<b<50. This compares with typical prior art sensitivity value of b=3 and EIA interference signal levels of b=7.5 for selectivity and spurious performance. The index of modulation is the ratio of the frequency deviation to the modulation frequency $$b = d_f/f_m$$

where:

$f_m$ is the audio modulation frequency; and $d_f$ is the deviation.

Internal memory 31 of the radio 17, such as EEPROM, is programmed with a temperature data base (see Table 1). The data base represents operating conditions for the radio and corresponding correction factors which need to be applied to the tuning network 52 in order to adjust the IF filter characteristic. The correction factors are applied by the D/A converter 29 in the form of data words, represented in Table 1 by the most significant bit (MSB) through to the least significant bit (LSB). These data words give the required voltage corrections for the varactor diodes.

TABLE 1

| Group | LF BPF Temp (°C.) | Address | Correction Factors/Data Words |
|---|---|---|---|
| 1 | −40° | I.F._−40°_Grp 1 | MSB . . . LSB |
|  | −30° | I.F._−30°_Grp 1 | MSB . . . LSB |
|  | −20° | I.F._−20°_Grp 1 | MSB . . . LSB |
|  | −10° | I.F._−10°_Grp 1 | MSB . . . LSB |
|  | 0° | I.F._0°_Grp 1 | MSB . . . LSB |
|  | etc | etc | etc |
|  | etc | etc | etc |
|  | +100° | I.F._+100°_Grp 2 | MSB . . . LSB |
| 2 | −40° | I.F._−40°_Grp 2 | MSB . . . LSB |
|  | −30° | I.F._−30°_Grp 2 | MSB . . . LSB |
|  | 0° | I.F._0°_Grp 2 | MSB . . . LSB |
|  | +100° | I.F._+100°_Grp 2 | MSB . . . LSB |
| etc |  |  |  |
| etc |  |  |  |
| 8 | −40° | I.F._−40°_Grp 8 | MSB . . . LSB |
|  | −30° | I.F._−30°_Grp 8 |  |
|  | 0° | I.F._0°_Grp 8 |  |
|  | +100° | I.F._+100°_Grp 8 | MSB . . . LSB |

In the above example, the data table comprises eight distinct operating groups 1–8. The operating groups represent statistical data concerning the tuning factors required for the adjustment of the IF filter characteristic at a range of operating temperatures between, say, −40° C. and +100° C. in 10° C. increments. Furthermore, each group 1–8 represents statistical data compiled with respect to the operating characteristics of a particular bandpass filter and its associated tuning network and, specifically, the behaviour of the particular bandpass filter and its associated tuning network at varying operating temperatures. It will be appreciated that Table 1 can be compiled because manufacturing technologies mean that bandpass filters and their associated tuning networks can be categorised into a number of groups, dependent upon their tolerances and ageing characteristics. Therefore, groups 1–8 not only take account of operating variations arising from temperature dependence of a intermediate bandpass filter and an associated tuning network 52, but also the variation in operational performance of the intermediate bandpass filter and the associated tuning network arising from ageing and manufacturing inconsistencies therein. It will be appreciated that the temperature range could be increased and that the increments made larger or smaller subject to requirement. It will also be appreciated that the number of groups in the table can be changed according to the number of poles in the bandpass filter and the tolerances to which the components are manufactured.

TABLE 2

| Signal Input | Modulation | Deviation | Level (dBm) | Frequency |
|---|---|---|---|---|
| Input A | 400 Hz | 5 kHz | Sensitivity Threshold (−115) | $F_o$ |
| Input B | 400 Hz | 5 kHz | RSSI Upper Linear Limit | $F_o$ |

TABLE 2-continued

| Signal Input | Modulation | Deviation | Level (dBm) | Frequency |
|---|---|---|---|---|
| Input C | 400 Hz | 5 kHz | (−40) Input B with IF Selectivity of Df (−20) | $F_o + Df$ |
| Input D | 400 Hz | 5 kHz | Input B with IF Selectivity of Df (−20) | $F_o - Df$ |
| Synthesizer | Unmodulated | 0 | Uncontrollable | $F_o + f_{if}$ | where:

$F_o$ is the received frequency at the antenna of the radio;

Df is the channel spacing of the system;

$F_o \pm Df$ represent adjacent channels; and $f_{if}$ is the central frequency of the crystal bandpass filter.

Table. 2, illustrates the input signal parameters for initial tuning of the radio 17.

With reference to Table 3, the radio 17 is initially tuned, at a laboratory or factory, with a maximum SINAD signal at a required operating frequency $F_o$ i.e. the radio 17 is tuned with minimum audio distortion. A second stage (input B) requires the radio to be tuned to a maximum RSSI at the operating frequency $F_o$. Further tuning stages require the subsequent alteration of the operating frequency to adjacent channels $F_o \pm Df$, and the subsequent tuning to minimum RSSI at these frequencies. Through this methodology the radio 17 is tuned to maximum selectivity and sensitivity. [Tuning refers to the alteration of the capacitance of the varactor diodes in the tuning networks by the controlled application of data words thereto, as determined by the D/A converter 29, whereby adjustment of the IF filter characteristic is achieved].

TABLE 3

| Signal Input | D/A Condition |
|---|---|
| Input A | Maximum SINAD |
| Input B | Maximum RSSI |
| Input C (tune to adjacent channel $F_o + Df$) | Minimum RSSI |
| Input D (tune to adjacent channel $F_o - Df$) | Minimum RSSI |

The internal operating temperature, at which the radio 17 is initially tuned, is recorded by a temperature measurement circuit, such as that provided by the Pendulum™ frequency oscillator, manufactured by Motorola Inc. The recorded operating temperature and the data words required to tune the radio to maximum selectivity and sensitivity are associated with one another and a correlation between this association and operating conditions set out in the data base is made. From this correlation, an operating condition which is substantially identical to the initial tuning condition is identified and, hence, characteristics for the varactor diodes of the tuning network are ascertained from the group designation. The group designation, i.e. 1–8, is recorded. Information contained in the recorded group may, at this point, be copied to an area of memory specifically designated as working memory. Furthermore, if the substantially identical operating condition (identified from the data base) is not an exact match with the recorded operating temperature and the data words required to tune the radio to maximum selectivity and sensitivity, the latter, more accurate initial tuning condition may be substituted for the substantially identical operating condition contained in the recorded group.

The radio 17 is now ready for operation, whereby the IF filter 48 is periodically tuned according to the internal operating temperature of the radio 17 and the corresponding operating characteristics defined by the recorded group designation and as stored in the working memory. For example, whilst the radio is in a receive mode, the internal operating temperature of the radio may be determined every 10 minutes, whereafter the IF filter charactersitic is adjusted accordingly.

The preferred embodiment of the present invention also provides a field tuning procedure. A user may wish to periodically re-tune the radio 17 to ensure optimum operation thereof. When field tuning of the radio 17 has been requested, a user is alerted by the radio that the "field tune procedure is operative" and that the radio 17 must not be moved until after completion of the tuning procedure. The user may be alerted by an audio tone and/or a visual display generated by the radio 17 in response to the request. The radio 17 conducts a search for the control channel 16, which is continually broadcast from the trunking site 12. In order that the field tuning procedure should progress, an input signal level for the control channel 16 must satisfy two criteria:

1) the input signal level ≦ RSSI upper linear level i.e. ≈−40 dBm; and 2) the input signal level ≧ RSSI lower linear level+20 dB i.e. ≈−70 dBm;

where the RSSI linear region is typically in the range of −90 dBm to −40 dBm;

and where the bandpass filter has a two-pole design with a 20 dB selectivity. If the radio 17 is unable to locate such a signal, the user is alerted to this fact by the generation of an audio tone and/or a visual display.

Adjustment of the intermediate bandpass filter characteristic is based on the production of an intermediate frequency signal $f_{if}$ generated by mixing the control channel signal 16 with a modulated synthesiser signal 44. The modulated synthesiser signal 44 is generated by modulation, in the synthesiser 38, of the reference frequency generated by the reference oscillator 40. In the case of field tuning, typical IF tuning parameters are indicated in Table 4.

TABLE 4

| Signal Input | Modulation | Deviation | Level (dBm) | Frequency |
|---|---|---|---|---|
| Synthesiser A | 100 Hz–400 Hz | 5 kHz | Uncontrollable | $F_o + f_{if}$ |
| Synthesiser B | 100 Hz–400 Hz | 5 kHz | Uncontrollable | $F_o + f_{if} + Df$ |
| Synthesiser C | 100 Hz–400 Hz | 5 kHz | Uncontrollable | $F_o + f_{if} - Df$ |
| Input (Identical for all Synthesizers) | Control Channel | | | $F_o$ |

In identical circumstance to those arising in the initial tuning methodology, the use of the modulated synthesiser signal 44 as a modulation mechanism for the control channel signal 16 ensures that the control channel signal 16 is modulated with a very high index of modulation i.e. a low frequency audio signal with high deviation, which fills the bandwidth of the IF filter 48 with a high density of Bessel lines. By using the RSSI signal, the radio is tuned according to Table 5.

TABLE 5

| Signal Type | D/A Condition |
|---|---|
| Synthesiser A | Maximum RSSI |
| Synthesiser B | Minimum RSSI |
| Synthesiser C | Minimum RSSI |

More specifically, the control channel $F_o$ is tuned to the centre of the passband of the intermediate bandpass filter, thereby acting as an accurate central frequency, and the filter characteristic is adjusted to substantially a maximum value for the RSSI thereat. Adjacent channel frequencies $F_o \pm Df$ are simulated by the radio and the filter characteristic of the intermediate bandpass filter is adjusted to substantially a minimum RSSI value thereat. More specifically, simulation of adjacent channels $F_o \pm Df$ is achieved in the synthesiser 38 by using a software algorithm to lock out received signals. Once the tuning network 52 has been re-calibrated by the application of a relevant D/A signal (as determined in Table 5), the internal operating temperature at which field tuning occurred is recorded and varactor characteristics are determined in identical steps to those performed in the initial tuning procedure for the radio 17. The user is then alerted to the that field tuning has been completed by the generation of an audio tone and/or a visual display. Subsequent, periodic re-tuning of the IF filter characteristic, arising from temperature variations in the radio, is achieved through the measurement of the radio's operating temperature and the subsequent adjustment of the IF filter characteristic using the statistical information stored in the data base or working memory.

It can be appreciated that an invention so designed and described produces the novel advantages of a radio having an automatic intermediate frequency filter calibration mechanism which improves overall radio sensitivity and selectivity and which compensates for temperature variations therein arising during operation of the radio. In addition, the intermediate frequency calibration mechanism described hereinabove further compensates for ageing of components contained within the IF filter. Moreover, the intermediate frequency calibration mechanism is implemented using a closed loop adjustment of the IF filter which requires no external apparatus. Furthermore, the intermediate frequency calibration mechanism provides the desirable attribute that, during calibration of the IF filter 48, the bandwidth of the IF filter 48 is filled with a very high index of modulation i.e. a high deviation, low frequency audio signal with a high density of Bessel lines.

We claim:

1. A radio communications system comprising:
   a) a radio base station for transmitting a control channel signal and a plurality of traffic channel signals separated in frequency from said control channel signal; and
   b) a radio communications device, receptive and responsive to said control channel signal and receptive to said plurality of traffic channel signals, comprising:
      i) a tuneable filter which substantially filters all but a selected traffic channel signal of said plurality of traffic channel signals, said tuneable filter having an adjustable characteristic;
      ii) a received signal strength indicator circuit, responsive to said tuneable filter, for providing a received signal strength indicator (RSSI) signal in respect of a signal transmitted from said base station;
      iii) a tuning circuit responsive to said RSSI signal and coupled to said tuneable filter for adjusting said filter characteristic; and
      iv) a reference signal coupled to the tunable filter, the reference signal being based at least in part on the control channel signal; wherein
   the tuning circuit adjusts said adjustable characteristic of the tunable filter by using the reference signal as an accurate central frequency for a passband of the tuneable filter.

2. The communications system in accordance with claim 1, wherein the communications device further comprises:
   a) an oscillator for generating a reference frequency signal;
   b) a frequency modulator for modulating said reference frequency signal, thereby generating a first modulated frequency signal; and
   c) a mixer for mixing said control channel signal with said first modulated frequency signal, thereby modulating said control channel signal with said first modulated frequency signal in order to produce a modulated intermediate frequency signal having a high index of modulation;
   wherein said tuneable filter is responsive to said modulated intermediate frequency signal, and said modulated intermediate frequency signal fills the bandwidth of the tuneable filter with a high density of Bessel lines during adjustment of said filter characteristic.

3. The communications system in accordance with claim 2, wherein the frequency modulator is a synthesiser.

4. The communications system in accordance with claim 3, wherein
   said synthesiser simulates an upper and a lower traffic channel, transmitted by said base station, adjacent to said central frequency, wherein said tuning network substantially minimises the RSSI signal in each of these adjacent channels, whereby said filter characteristic is substantially adjusted to a maximum insertion loss thereat.

5. The communications system in accordance with claim 1, further comprising a tuning network responsive to the RSSI signal and coupled to said tuneable filter to facilitate adjustment of said filter characteristic, the tuning network comprising at least one varactor diode.

6. The communications system in accordance with claim 1, wherein the communications device further comprises means for alerting a user when a measured RSSI for said control channel signal is below a level sufficient to sustain adjustment of said filter characteristic.

7. The communications system in accordance with claim 3, wherein the communications device further comprises
   a tuning network responsive to the RSSI signal and coupled to said tuneable filter to facilitate adjustment of said filter characteristic; and
   a microprocessor which controls the adjustment of said tuning network and which is coupled to said synthesiser;
   wherein the microprocessor prevents processing of a signal, transmitted from the base station and received by the communications device by locking out a software algorithm controlled by the microprocessor and associated with the processing of the received signal.

8. The communications system in accordance with claim 7, wherein the communications device further comprises a D/A converter responsive to said microprocessor and coupled to said tuning network;

wherein data words, generated by the microprocessor in response to said RSSI signal, are applied to the D/A converter in order to adjust the tuning network and thereby adjust the filter characteristic of said tuneable filter.

9. The communications system in accordance with claim 8, wherein the communications device further comprises memory, coupled to said microprocessor, wherein the memory comprises:

a statistically compiled data table relating data words required to adjust said filter characteristic of said tuneable filter to both an operating temperature for the communications device and operating characteristics particular to a tuneable filter and an associated tuning network;

wherein said operating characteristics are subject to variation through ageing of the tuneable filter and tuning network and to variations arising from manufacturing tolerances.

10. The communications system in accordance with claim 1, wherein the communications device further comprises internal temperature measurement circuitry for measuring the operating temperature of the communications device; whereby the filter characteristic of said tuneable filter is adjusted, periodically, according to the operating temperature of the communications device.

11. The communications system in accordance with claim 10, wherein the periodic adjustment of said filter characteristic occurs approximately every 10 minutes.

12. The communications system in accordance with claim 1 wherein the communications device further comprises means for alerting a user that adjustment of said filter characteristic has been completed.

13. The communications system in accordance with claim 12, wherein the means for alerting the user is an audio signal, a visual signal or a combination of both an audio signal and a visual signal.

14. The communications system in accordance with claim 1, wherein the tuneable filter comprises a 2-pole monolithic crystal bandpass filter.

15. The communications system in accordance with claim 1, wherein the system is a trunked radio system having full duplex or half duplex operating capabilities.

16. The communications system in accordance with claim 1, wherein adjustment of said filter characteristic involves a closed loop calibration of the tuneable filter.

17. The communications system in accordance with claim 1, wherein the communications device further comprises means for allowing a user to request that said filter characteristic be adjusted, using the tuning circuit, whilst the communications device is in an operational environment.

18. The communications system in accordance with claim 1, wherein the the control channel signal is unmodulated.

19. A method of adjusting a filter characteristic of a tuneable filter of a communications device, the method comprising the steps of:

a) tuning the tuneable filter of the communications device to receive a control channel signal transmitted at an accurate frequency by a base station responsible for the control of said communications device;

b) establishing a centre for a passband of the tuneable filter using the accurate frequency of the control channel signal;

c) adjusting said filter characteristic to a minimum insertion loss at said centre of the passband, thereby optimising selectivity and sensitivity for the communications device;

d) subsequently tuning the tuneable filter to selectively receive a traffic channel signal, from a plurality of traffic channel signals transmitted by said base station, by filtering all but a selected traffic channel signal of said plurality of traffic channel signals.

20. A method of adjusting the filter characteristic of a tuneable filter in accordance with claim 19, the step of adjusting further comprising the steps of:

a) generating a reference frequency within the communications device;

b) generating a first modulated frequency signal by modulating said reference frequency;

c) modulating said control channel signal with said first modulated frequency signal, thereby producing a modulated intermediate frequency signal having a high index of modulation;

d) applying said modulated intermediate frequency signal to the tuneable filter, and saturating the bandwidth thereof with a high density of Bessel lines.

21. A method of tuning an intermediate frequency filter in accordance with claim 20, the step of adjusting further comprising the step of:

a) measuring the operating temperature of the communications device and adjusting, periodically, said filter characteristic of the tuneable filter according to the operating temperature of the communications device.

22. A method of adjusting the filter characteristic of a tuneable filter in accordance with claim 21, the step of adjusting further comprising the steps of:

a) providing a received signal strength indicator (RSSI) signal in respect of said control channel signal;

b) substantially maximising the RSSI signal at said centre of the passband by adjusting said filter characteristic to substantially a minimum insertion loss thereat.

23. A method of adjusting the filter characteristic of a tuneable filter in accordance with claim 22, the step of adjusting further comprising the step of:

a) simulating adjacent upper and lower traffic channels; and b) substantially minimising the RSSI signal in each of the adjacent traffic channels by adjusting said filter characteristic to substantially a maximum insertion loss thereat.

24. A method of adjusting the filter characteristic of a tuneable filter in accordance with claim 23, wherein the step of simulating adjacent upper and lower traffic channels further comprises the step of:

a) preventing processing of a signal, transmitted from the base station and received by the communications device, during simulation of said adjacent upper and lower traffic channels by locking out a software algorithm associated with the processing of said signal.

25. A method of adjusting the filter characteristic of a tuneable filter in accordance with claim 24, the step of adjusting further comprises the step of adjusting the capacitance of at least one varactor diode coupled to the tuneable filter, thereby adjusting said filter characteristic.

26. A method of adjusting the filter characteristic of a tuneable filter in accordance with claim 25, wherein the step of adjusting further comprises the step of:

a) applying data words, generated by a microprocessor in response to said RSSI signal, to a D/A converter responsive to said microprocessor and coupled to said tuning network, whereby application of the data words to the tuning network adjusts the capacitance thereof and thereby tunes the tuneable intermediate frequency filter.

27. A method of adjusting the filter characteristic of a tuneable filter in accordance with claim 21, the method further comprising the steps of:

a) compiling a statistical data table relating data words required to adjust said filter characteristic to both operating temperatures for the communications device and operating characteristics particular to a tuneable filter and an associated tuning network; and b) loading said statistical data table into memory contained in the communications device;

wherein the step of measuring the operating temperature of the communications device further comprises the steps of:

c) correlating the measured operating temperature to the statistical data table;

d) ascertaining an operating characteristic, particular to a tuneable filter and its associated tuning network, from said correlation;

e) adjusting said filter characteristic of the tuneable filter by applying a data word, derived from the data table, corresponding to both the measured temperature and the ascertained operating characteristic.

28. A method of adjusting the filter characteristic of a tuneable filter in accordance with claim 27, wherein the step of tuning is preceded by the step of:

a) a user requesting that the communications device be tuned whilst the communications device is in an operational environment.

29. A method of adjusting the filter characteristic of a tuneable filter in accordance with claim 28, wherein the step of adjusting is preceded by the step of:

a) measuring a RSSI signal of the control channel signal;

b) alerting a user when the measured RSSI signal for said control channel signal is below a level sufficient to sustain adjustment of said filter characteristic.

30. A method of adjusting the filter characteristic of a tuneable filter in accordance with claim 28, wherein the step of adjusting is proceeded by the step of:

a) alerting a user that adjustment of said filter characteristic has been completed.

31. A method of adjusting the filter characteristic of a tuneable filter in accordance with claim 30, wherein the step of generating an alert comprises the steps of:

generating either an audio signal, a visual signal or a combination of both an audio signal and a visual signal.

32. A method of adjusting the filter characteristic of a tuneable filter in accordance with claim 31, wherein the method of tuning the communications device involves a closed loop calibration of the tuneable filter.

33. A method of adjusting the filter characteristic of a tuneable filter in accordance with claim 19, wherein the step of adjusting is preceded by the step of:

a) siting the communications device at a fixed location at which the communications device remains until the step of adjusting said filter characteristic is complete.

34. A method of adjusting a filter characteristic of a tuneable intermediate frequency filter of a radio communications receiver, the method comprising the steps of:

a) supplying a parameter to the tuneable filter by means of a digital-to-analog converter to provide a first filter characteristic;

b) tuning the tuneable filter to receive a control channel signal transmitted at an accurate frequency by a base station responsible for the control of said communications receiver;

c) establishing a centre for a passband of the tuneable filter using the accurate frequency of the control channel signal;

d) supplying to the tuneable filter a new parameter representative of a new filter characteristic, thereby adjusting said filter characteristic to a minimum insertion loss at said centre of the passband and optimising selectivity and sensitivity for the communications receiver;

e) subsequently tuning the tuneable filter to selectively receive a traffic channel signal, from a plurality of traffic channel signals transmitted by said base station, by filtering all but a selected traffic channel signal of said plurality of traffic channel signals.

\* \* \* \* \*